United States Patent [19]

McColgin

[11] Patent Number: 5,017,459
[45] Date of Patent: May 21, 1991

[54] LIFT-OFF PROCESS

[75] Inventor: William C. McColgin, Pittsford, N.Y.

[73] Assignee: Eastman Kodak Company, Rochester, N.Y.

[21] Appl. No.: 343,316

[22] Filed: Apr. 26, 1989

[51] Int. Cl.$^5$ .............................................. G03C 5/00
[52] U.S. Cl. .................................. 430/299; 430/317; 430/323; 430/324
[58] Field of Search ............... 430/312, 314, 315, 317, 430/299, 329, 323, 324

[56] References Cited

U.S. PATENT DOCUMENTS

| | | | |
|---|---|---|---|
| 3,490,943 | 1/1970 | Werdt | 117/212 |
| 4,144,101 | 3/1979 | Rideout | 148/1.5 |
| 4,248,948 | 2/1981 | Matsuda | 430/5 |
| 4,253,888 | 3/1981 | Kikuchi | 148/187 |
| 4,448,800 | 5/1984 | Ehara et al. | 427/39 |
| 4,451,328 | 5/1984 | Dubois | 156/656 |
| 4,497,684 | 2/1985 | Sebasta | 156/643 |

FOREIGN PATENT DOCUMENTS 52571 3/1985 Japan .
100432 6/1985 Japan .

OTHER PUBLICATIONS

Brewer et al., "The Reduction of the Standing Wave Effect in Positive Photoresist", J. of Appl. Photographie Eng., vol 7(6), Dec. 1981.
Technical Data Handbook for ARC, Brewer Science.
"Lift-Off Techniques for Fine Line Metal Patterning", Semiconductor International, Dec. 1981, pp. 72-88.
IBM Technical Disclosure Bulletin vol. 29, #11, Apr. 1967.

Primary Examiner—Jose Dees
Attorney, Agent, or Firm—Raymond L. Owens

[57] ABSTRACT

A lift-off process for forming patterned films of particular use for films of metals that need to be deposited in a non-directional fashion. The process features a lift-off mask that includes a thin coating of Brewer Science ARC ® PN-2 as an assisting layer under a photoresist layer.

25 Claims, 1 Drawing Sheet

LIFT-OFF PROCESS

FIELD OF THE INVENTION

This relates to a process for patterning thin films, for example of the type useful in microelectronics, and more particularly to patterning such films by a lift off process.

BACKGROUND OF THE INVENTION

In the manufacture of devices useful in microelectronics, there sometimes arises a need for patterning a film of a material that is difficult to etch in a fine pattern, such as one involving line widths narrower than 2 microns. In such instances it is useful to employ a lift off process for patterning the film.

The basic principles of the lift off process for patterning thin films are set forth in a paper in *Semiconductor International* by J. M. Frary and P. Reise and entitled "Lift off Techniques For Fine Line Metal Patterning," pages 72 88, December, 1981.

In a lift off process, a continuous masking layer is first deposited on a desired substrate and then patterned, typically photolithographically, to form openings that expose the substrate essentially in the pattern desired for the thin film. The thin film is then deposited over the resulting mask and the exposed portions of the substrate. Finally, the mask is removed, lifting off the thin film where it has deposited on the mask, but leaving it in place where it has deposited on the exposed substrate.

A basic requirement of the lift-off process is that the deposited film not achieve step coverage and not be continuous across the openings in the mask. The discontinuity in the thin film will distinguish the areas of the film that are removed from those left behind to form the desired pattern. Additionally, the discontinuity is important to facilitate entry of the etchant or solvent used in the removal selectively of the mask.

In a practical process the lift off mask needs to have certain characteristics. It generally needs to be thicker than the thin film to be patterned and should be readily patterned to the resolution desired for this pattern. Additionally, it should be easily removed selectively, without affecting the thin film areas left behind on the substrate.

Additionally, for best results, the film should be deposited in a manner that little coats the sidewalls of the openings in the mask, since coatings on the sidewalls may provide unwanted topography that complicates further processing. Usually this is achieved by depositing the film in a directional manner. However, in certain instances the film to be deposited is of a material that is not readily amenable to directional deposition, as is the case with indium tin oxide (ITO) that needs to be sputtered on to insure the proper stoichiometry needed for proper electrical conductivity and high light transmissivity for its usual role as a light transmissive electrode in a photosensitive device.

In such instances where non-directional deposition is used, it is especially important to utilize a suitable profile in the openings in the mask to avoid sidewall deposits and to insure discontinuity of the film. As used herein, "non-directional" describes a deposition process in which significant numbers of the particles being deposited are directed at a desired target at angles u greater than about 15 degrees from the average depositing direction which usually is normal. Typical lift off profiles are discussed in the aforementioned paper and typically involve either a capped or reverse slope profile. However, achieving a suitable profile can be difficult and the present invention involves a technique for achieving a particular lift off profile essentially favorable for non-directional deposition.

As is discussed in the aforementioned paper, one technique for achieving a suitable lift off profile for the mask is to use a mask that comprises two layers, a bottom assisting layer proximate the substrate and a top photoresist layer over the assisting layer. The top photoresist layer is adapted for high resolution patterning while the bottom layer is not. In particular, the patterning of the mask is done in a manner to cause the bottom layer to be undercut sufficiently that the sidewalls of the openings formed in the bottom layer are displaced significantly from the openings formed in the top layer. As a result sidewall coating of the bottom layer is readily avoided even when the film is deposited in a non-directional fashion, as by sputtering.

In the above described paper, among the lift off processes discussed, are some that employ polyimides as the assisting layer in which undercutting is achieved during the photoresist development, since these materials advantageously have an etch capability that is compatible with photoresist processing. However, achieving the desired degree of undercutting appears to have been difficult and to require relatively complex processing.

In particular, no simple lift-off process appears to have been available to achieve films of high resolution, e.g. line widths narrower than 2 microns, of shallow thickness, e.g. films no thicker than 2000 Angstroms, and of a material that needs to be sputtered for deposition, e.g. indium tin oxide. For forming such films by a lift off process, it is important to provide in the openings of the mask an aspect ratio of at least one, where such ratio is the length of undercut to the thickness of the assisting layer being undercut. However, to achieve such an aspect ratio with thick assisting layers requires a large amount of undercutting that militates against achieving fine patterns.

SUMMARY OF THE INVENTION

The present invention is a lift-off process of particular interest for providing a finely patterned thin film of a material that is not readily amenable to directional deposition. In particular, the invention is a lift-off process that employs a composite mask having a bottom assisting layer and a top photoresist layer in which the bottom layer is thin and of a material that can be suitably undercut in the development (etching) used to develop (etch) the photoresist to provide an aspect ratio of at least one for the openings. The layers are patterned photolithographically with an etchant selected to anisotropically etch the top layer and isotropically etch the bottom layer.

More particularly, in a preferred embodiment the resist layer is of a polyimide such as Brewer Science ARC® PN-2. Brewer ARC PN-2 is sold for use primarily as a spun-on anti-reflective bottom coating in optical resist lithography processes and is designed to be simultaneously developed in a positive resist developer during the resist development.

In a Technical Data Handbook relating to various anti-reflection coatings available from Brewer Science, their possible use in reverse lift off processes is suggested, but the particular unexpected superiority of ARC PN-2 in a lift-off process for use with thin films in accordance with the invention is believed not to have been appreciated. ARC PN-2 is generically a polyamic acid with an absorbing or anti-halation dye to limit undesired light scattering or reflection during the lithographic exposure of the overlying photoresist layer. The polyamic acid is quite soluble in the photoresist developer and in practice is partially imidized on the substrate by baking. Fully imidized PN-2 is not soluble so it is important for anti reflection purposes to bake (imidize) it just enough to let it develop at a similar rate to that of the exposed photoresist. Underbaked excessively, it will dissolve out from under the overlying photoresist and wash away or distort the desired pattern. Underbaked slightly, it will result in the undercutting desirable for this invention. Overbaked, it will be difficult to remove and tend to leave a scum. The proper baking is best determined by trial and error for a particular set of conditions.

The invention will be better understood from the following more detailed description taken with the accompanying drawings.

The drawings are not to scale.

DETAILED DESCRIPTION

Figure 1:
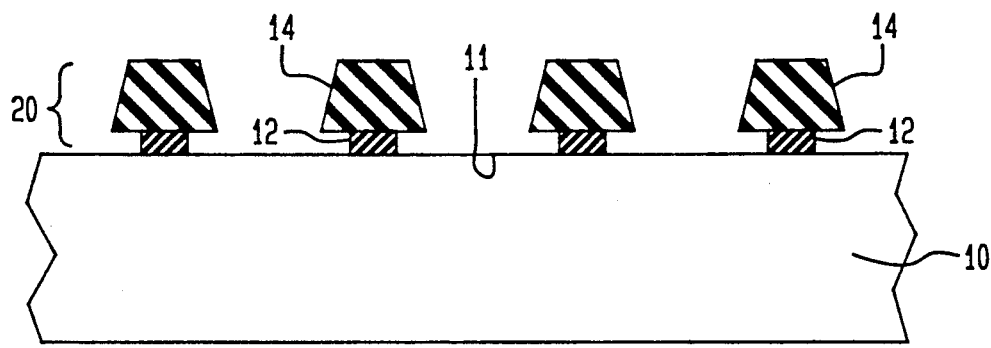
FIGS. 1 through 3 depict the results of various steps of a process in accordance with an illustrative embodiment of the invention.

The invention will be described with specific reference to an illustrative embodiment for depositing a finely patterned thin film of indium tin oxide (ITO) on a desired substrate, such as a monocrystalline silicon wafer (substrate 10), about 100 mils thick, as is shown in FIG. 1. Advantageously, the substrate 10 is first cleaned in standard fashion to promote good adhesion for a bottom assisting layer. Then for forming such a layer, a coating (layer) 12, advantageously of between 1600-2000 Angstroms thickness of Brewer Science ARC PN-2, is spun on, typically at 5000 revolutions per minute, over a top surface 11 of substrate 10.

Then the spun-on coating is partially imidized by baking on a standard hot plate-chill plate (not shown) at about 163° C. for about 93 seconds, for use as the assisting layer 12 of a lift off mask to be formed.

Next the assisting layer 12 is coated with a photoresist layer 14, of a material such as KTI 820, to provide a resulting total thickness of about 1.2 microns, although photoresist layers as thin as about 4000 Angstroms are feasible.

Then the photoresist layer 14 is prebaked at about 125° C. for 19 seconds in close proximity to a hotplate (not shown) and then for 30 seconds in contact with the hotplate. This completes formation of a composite mask layer 20 comprising layers 12 and 14.

Then in conventional fashion the photoresist layer 14 is exposed to the desired pattern, by irradiation with light of a suitable wavelength, e.g., 4360 Angstroms, through an optical mask (not shown) with the desired pattern, typically for about 100 milliseconds, in a commercial ASET SLR 800 stepper.

Next, the photoresist layer 14 and the ARC PN-2 layer 12 are developed or etched together in a single step in KTI 934 developer (1:1 concentration) by immersion with no agitation for about 110 seconds. By such immersion, the exposed portions of the photoresist layer 14 are first etched directionally anisotropically, but, after the assisting layer 12 is reached, the etching proceeds isotropically to cause undercutting of the assisting layer 12. If the immersion is discontinued when the underlying substrate top surface 11 is reached, there is formed an opening in which the undercutting of the assisting layer 12 has an aspect ratio of about one, corresponding to a lateral undercut about equal to the original thickness of the assisting layer 12. It can be readily appreciated from reviewing FIG. 2 that excessive undercutting would leave inadequate support for the photoresist layer 14.

A typical result after sectioning is shown in FIG. 1. The substrate 10 supports on the top surface 11 the composite mask 20 comprising the assisting layer 12 of ARC PN-2 and the top layer 14 of photoresist. The lateral width of the undercut in the assisting layer 12 is approximately 2000 Angstroms on each side, about the same as the thickness of the assisting layer for an aspect ratio of one. The pattern of lines and spaces in the photoresist 14 are approximately equal in width, each about 2 microns. In other examples with lower ARC PN-2 bake temperatures, for example 158° C., undercuts of as much as 8000 Angstroms were obtained.

Figure 2:
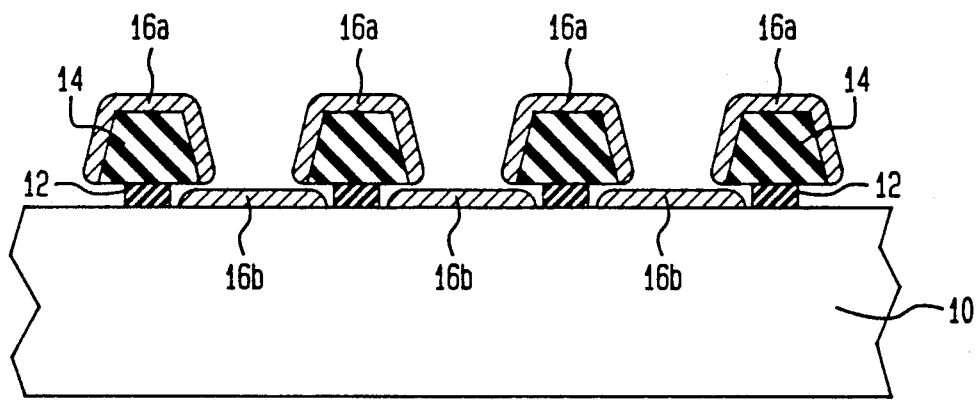

Thereafter, the substrate 10 with composite mask 20 on top surface 11 was put in a standard sputtering chamber (not shown) and a layer 16 of indium tin oxide (ITO) about 560 Angstroms thick was sputtered over the masked top surface of the substrate 10 in the usual fashion. The result is seen in FIG. 2 and includes a film 16 of ITO that includes portions 16a covering upper and side portions of the photoresist layer 14 and portions 16b directly covering portions of the top surface 11 of the substrate 10.

Figure 3:
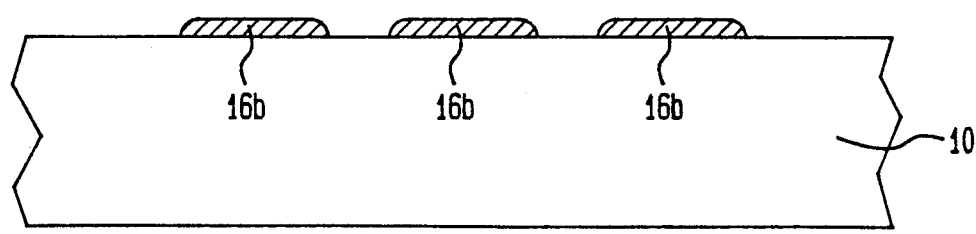

The substrate 10 was then treated in an ultrasonic bath (not shown) containing N-methyl pyrrolidinone to remove the composite mask layer 20 and portions 16a of film 16. The result, shown in FIG. 3, is a substrate 10 free both of the photoresist 14 and the assisting layer 12 and including only the film pattern formed by portions 16b of the deposited ITO film 16.

It is to be appreciated and understood that the specific embodiments of the invention are merely illustrative of the general principles of the invention. Various modifications may be made consistent with the principles set forth. For example, as previously indicated, the parameters of the baking and development of the ARC PN-2 can be varied. Still further, the dimensions of the patterned film deposited as well as its material can be varied. Still further, the invention is applicable to the formation of other types of films, such as chromium and gold films which can be deposited by sputtering or non-directional evaporation. Additionally, the substrate can be of other suitable materials, such as compound semiconductors either of the Group III-V or Group II-VI kind.

What is claimed is:

1. A process for providing a patterned film on a surface of a substrate comprising the steps of:

forming for use as a mask a dual layer over said surface, said dual layer comprising a bottom assisting layer of a thickness no greater than about 2000 Angstroms and a top layer of photoresist of a thickness of at least about 4000 Angstroms;

patterning photolithographically the dual layer, with an etchant selected to anisotropically etch the top layer and isotropically etch the bottom layer, in a manner to form sidewalls in the openings of the resulting pattern that have an undercut profile with an aspect ratio of at least one in the assisting layer, the pattern in the photoresist layer essentially corresponding to the pattern desired for the film;

depositing the desired film non-directionally over the surface of the photoresist layer and over portions of the substrate exposed by the openings of the pattern in the photoresist layer, such that said film is discontinuous between said portions deposited on the substrate and said portions deposited on said photoresist layer; and removing selectively the dual layer and leaving the portions of the film deposited on the substrate.

2. The process of claim 1 in which the patterning of both layers of the dual layer is done in a common development step.

3. The process of claim 1 in which the bottom assisting layer of the dual layer is of a polyamic acid that is only partially imidized.

4. The process of claim 3 in which the bottom layer is a polyimide.

5. The process of claim 4 in which the patterning of both layers of the dual layer is done in a common development step.

6. The process of claim 5 in which the film is of indium tin oxide of a thickness of less than 2000 Angstroms and is deposited non-directionally by sputtering.

7. The process of claim 5 in which the film is of chromium of a thickness of less than 2000 Angstroms and is deposited non-directionally by sputtering.

8. The process of claim 1 in which the photolithographic patterning of the dual layer comprises first exposing the photoresist layer to radiation in accordance with a desired pattern for the film and then developing the exposed photoresist layer and the bottom layer in a common step.

9. The process of claim 8 in which the bottom layer is a polyimide.

10. The process of claim 9 in which the film is of indium tin oxide of a thickness of less than about 2000 Angstroms and is deposited by sputtering.

11. The process of claim 10 in which the pattern on the film includes lines that are no wider than 2 microns.

12. The process of claim 9 in which the film is of chromium of a thickness of less than 2000 Angstroms and is deposited by sputtering.

13. A process for providing a patterned film on a surface of a substrate comprising the steps of:

forming for use as a mask a dual layer over said surface, said dual layer comprising a bottom layer of a polyamic acid that is partially imidized and a top layer of photoresist;

forming photolithographically the dual layer with an etchant selected to anisotropically etch the top layer and isotropically etch the bottom layer, so as to form a pattern of openings in the dual layer in which the pattern of openings in the photoresist layer matches the pattern desired for the film and the pattern of openings in the bottom layer has an undercut profile with an aspect ratio of at least one;

depositing the desired film non-directionally over the surface of the photoresist layer and over portions of the substrate exposed by the openings of the pattern in the photoresist layer, such that said film is discontinuous between said portions deposited on the substrate and said portions deposited on said photoresist layer; and removing selectively the dual layer and leaving the portions of the film deposited on the substrate.

14. The process of claim 13 in which the patterning of both layers of the dual layer is done in a common development step.

15. The process of claim 13 in which the bottom layer is a polyimide.

16. The process of claim 15 in which the patterning of both layers of the dual layer is done in a common development step.

17. The process of claim 16 in which the film is of indium tin oxide of a thickness less than that of the bottom layer and is deposited by sputtering.

18. The process of claim 16 in which the film is of chromium of a thickness of less than 2000 Angstroms and is deposited by sputtering.

19. The process of claim 13 in which the photolithographic patterning of the dual layer comprises first exposing the photoresist layer in accordance with a desired pattern for the film and then developing the exposed photoresist layer and the bottom layer in a common step.

20. The process of claim 19 in which the bottom layer is a polyimide.

21. The process of claim 20 in which the film is of indium tin oxide of a thickness of less than about 2000 Angstroms and is deposited by sputtering.

22. The process of claim 20 in which the film is of chromium of a thickness of less than 2000 Angstroms and is deposited by sputtering.

23. The process of claim 21 in which the pattern on the film includes lines that are no wider than 2 microns.

24. A process for providing a patterned film on a surface of a substrate comprising the steps of:

forming for use as a mask a dual layer over said surface, said dual layer comprising a bottom layer of a polyamic acid that is partially imidized and has a thickness of no greater than about 2000 Angstroms and a top layer of photoresist of a thickness of at least about 4000 Angstroms;

forming photolithographically in a common development step a pattern of openings in the dual layer in which the pattern of openings in the photoresist layer matches the pattern desired for the film and the pattern of openings in the bottom layer has an undercut profile with an aspect ratio of at least one;

depositing the desired film non-directionally over the surface of the photoresist layer and over portions of the substrate exposed by the openings of the pattern in the photoresist layer, such that said film is discontinuous between said portions deposited on the substrate and said portions deposited on said photoresist layer; and removing selectively the dual layer and leaving the portions of the film deposited on the substrate.

25. The process of claim 24 in which the bottom layer is a polyimide and the film is of indium tin oxide of a thickness of less than 2000 Angstroms and is deposited non-directionally by sputtering.

* * * * *